United States Patent [19]

Greenwood et al.

[11] Patent Number: 4,691,117
[45] Date of Patent: Sep. 1, 1987

[54] SWITCH DEVICE

[75] Inventors: John C. Greenwood, Harlow; Robert J. Hodges, Cheshunt; Robert Sheppard, Sawbridgeworth, all of Great Britain

[73] Assignee: International Standard Electric Company, New York, N.Y.

[21] Appl. No.: 837,562

[22] Filed: Mar. 3, 1986

Related U.S. Application Data

[63] Continuation of Ser. No. 605,174, Apr. 30, 1984, abandoned.

[30] Foreign Application Priority Data

May 10, 1983 [GB] United Kingdom ................ 8312776

[51] Int. Cl.$^4$ ............................................ H01L 41/08
[52] U.S. Cl. .................................... 307/119; 310/339; 310/319; 307/149
[58] Field of Search ............ 307/115, 119, 149; 200/6, 33 B, 36, 37 R, 37 A, 38 R, 38 B; 310/311, 330, 369, 319, 339; 338/2, 47, 114

[56] References Cited

U.S. PATENT DOCUMENTS

| | | | |
|---|---|---|---|
| 3,174,419 | 3/1965 | Sable | 310/339 X |
| 3,266,303 | 8/1966 | Pfann | 179/110 D |
| 3,278,881 | 10/1966 | Anderson et al. | 338/2 |
| 3,315,200 | 4/1967 | Hannay | 338/2 |
| 3,455,165 | 7/1969 | Huet | 338/2 X |
| 3,649,856 | 3/1972 | O'Neill | 310/369 X |
| 3,679,988 | 7/1972 | Haydon | 200/38 B X |
| 3,965,453 | 6/1976 | Seidel et al. | 338/2 X |
| 4,050,532 | 9/1977 | Proui et al. | 177/256 X |
| 4,106,343 | 8/1978 | Cook | 73/387 |
| 4,126,039 | 11/1978 | Smith et al. | 73/862.53 X |
| 4,190,785 | 2/1980 | Kompanek | 310/311 X |
| 4,203,088 | 5/1980 | Sado et al. | 338/114 |
| 4,203,327 | 5/1980 | Singh | 338/2 X |
| 4,210,895 | 7/1980 | Sado et al. | 338/114 X |
| 4,379,245 | 4/1983 | Goldstein | 310/319 |
| 4,409,548 | 10/1983 | Focht | 310/339 X |

Primary Examiner—William M. Shoop, Jr.
Assistant Examiner—Shik Luen Paul Ip
Attorney, Agent, or Firm—T. L. Peterson

[57] ABSTRACT

A contactless electrical switch includes a switch element comprising a piezo-resistive transducer (25). Coded toothed cams (16) operated via a shaft (14) deflect the transducer (25) causing corresponding changes in stress and hence resistance. The output of the transducer is amplified and fed to logic circuitry which determines a corresponding current path.

10 Claims, 3 Drawing Figures

SWITCH DEVICE

This application is a continuation of application Ser. No. 605,174, filed Apr. 30, 1984, now abandoned.

BACKGROUND OF THE INVENTION

This invention relates to electrical switches, and in particular to switches of the contactless type wherein the switching function is performed by a solid state semiconductor element.

The performance of conventional electrical switch contacts is subject to degradation caused by a number of factors. In particular contact wear can arise from mechanical wiping of the contacts and from arcing between the contacts during operation of the switch. Contaminant materials can form deposited coatings on the contact surfaces causing unacceptably high resistance. Furthermore, unless precautions are taken, contact bounce can occur on closing the switch giving rise to electrical noise. This problem renders conventional switches inappropriate for use in conjunction with integrated circuits where a significant mismatch in lifetime and reliability are apparent. The object of the present invention is to minimise or to overcome these disadvantages.

SUMMARY OF THE INVENTION

According to one aspect of the invention there is provided a contactless electrical switch, including a switch element comprising a piezo-resistive body flexible between first and second configurations, by operation of a switch actuator member, and means responsive to the resistance conditions of the body in its first and second configuration for respectively enabling and disabling a current path through the switch.

According to another aspect of the invention there is provided a contactless electrical switch, including two or more flexible piezoelectric transducer elements, toothed cams one for each said element and rotatable on a common shaft, and logic means responsive to resistance change caused by deflection of the elements by the cams for enabling corresponding current paths, and wherein each said cam is so profiled that rotation of the shaft generates a digital code characteristic of the degree of rotation of the shaft.

According to a further aspect of the invention there is provided a transducer assembly for a contactless switch, the assembly including a support structure, one or more flexible piezo-resistive transducer elements mounted on the support structure, and means mounted on the support structure adjacent the one or more transducer elements whereby each said element is urged away from an unstressed condition.

Typically the piezo-resistive material is silicon although other materials can of course be used. Single crystal silicon has a tensile modulus comparable with that of steel and exhibits no plastic flow even up to the fracture point. Flexible switch elements constructed from this material can therefore tolerate relatively large deflections and hence a very long working life.

BRIEF DESCRIPTION OF THE DRAWING

Embodiments of the invention will now be described with reference to the accompanying drawings in which.

DETAILED DESCRIPTION

Figure 1:
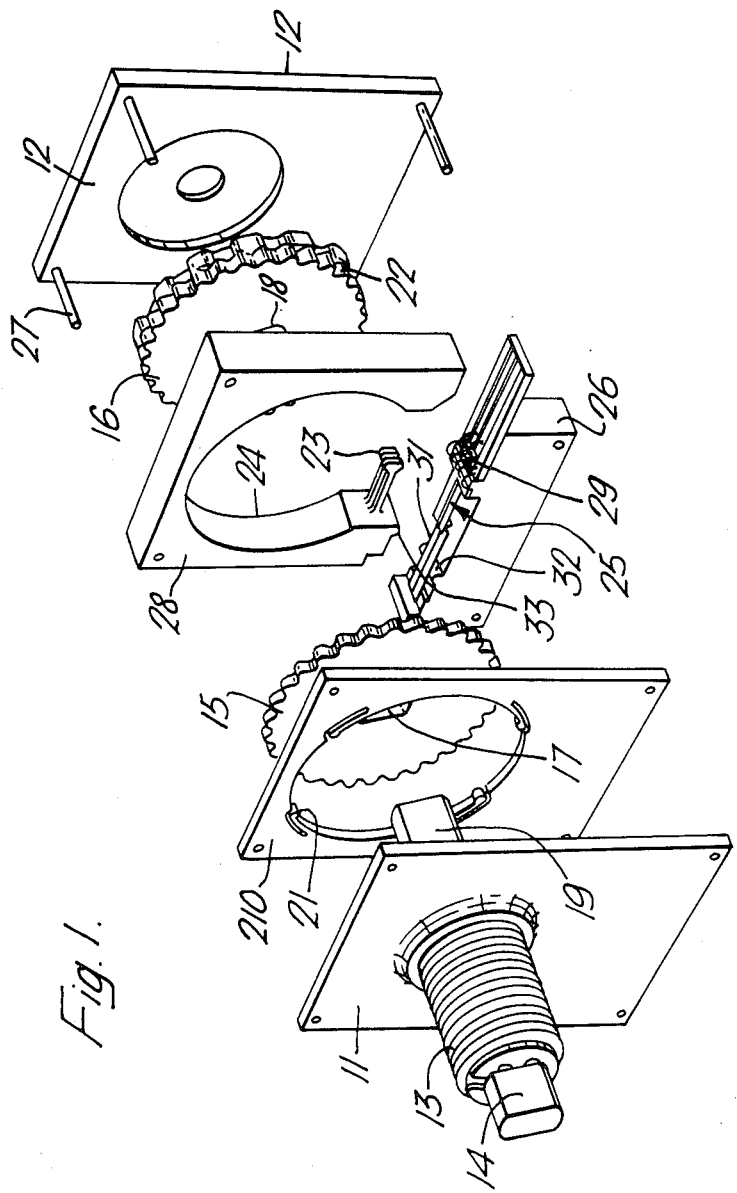
FIG. 1 is an exploded view of a rotary switch assembly incorporating a piezo-resistive switch element.

Referring to FIG. 1, the switch assembly is mounted between a front plate 11 and a back plate 12, the front plate being provided with a boss 13 in which an operating spindle 14 is located. This spindle carries a detent disc 15 and a code disc 16, these discs having axial openings 17 and 18 respectively that engage the spindle 14. Relative rotation between the discs and spindle is prevented by flats 19 on the spindle which flats engage corresponding registration flats in the disc openings.

The detent disc 15 is disposed in an opening in a detent plate 210 and engages one or more inwardly directed detent pawls 21 mounted on a detent plate 210 to provide the necessary detent action of the switch.

The code disc 16 has one or more rows of circumferential projections 22 which, in use, engages corresponding resilient cam followers 23 carried on a support body 24. These cam followers 23 transmit motion from the code disc to piezoresistive transducer elements 25 supported on a tranducer block 26.

Alignment of the assembly may be facilitated by pins 27 extending from the back plate 12 and on which the various static components are located via corresponding openings 28.

In the assembled switch rotation of the code disc 16 via the shaft 14 causes corresponding deflection and release of the cam followers 23 by the projections 22 on the disc. This in turn causes flexure of the transducer elements 25. The resistance changes caused by flexure of the transducer elements are sensed by an amplifier chip 29 coupled to the elements 25 and the amplified signals are fed to logic decoding circuitry (not shown) which translates the switch output signals into corresponding current paths.

Although two code discs and associated transducer element are shown in FIG. 1 it will be appreciated that further discs and transducers may be mounted within the switch assembly to provide a gauged switching arrangement.

Figure 3:
FIGS. 2 and 3 show respectively plan and sectional views of the switch element of the assembly of FIG. 1.
Figure 2:
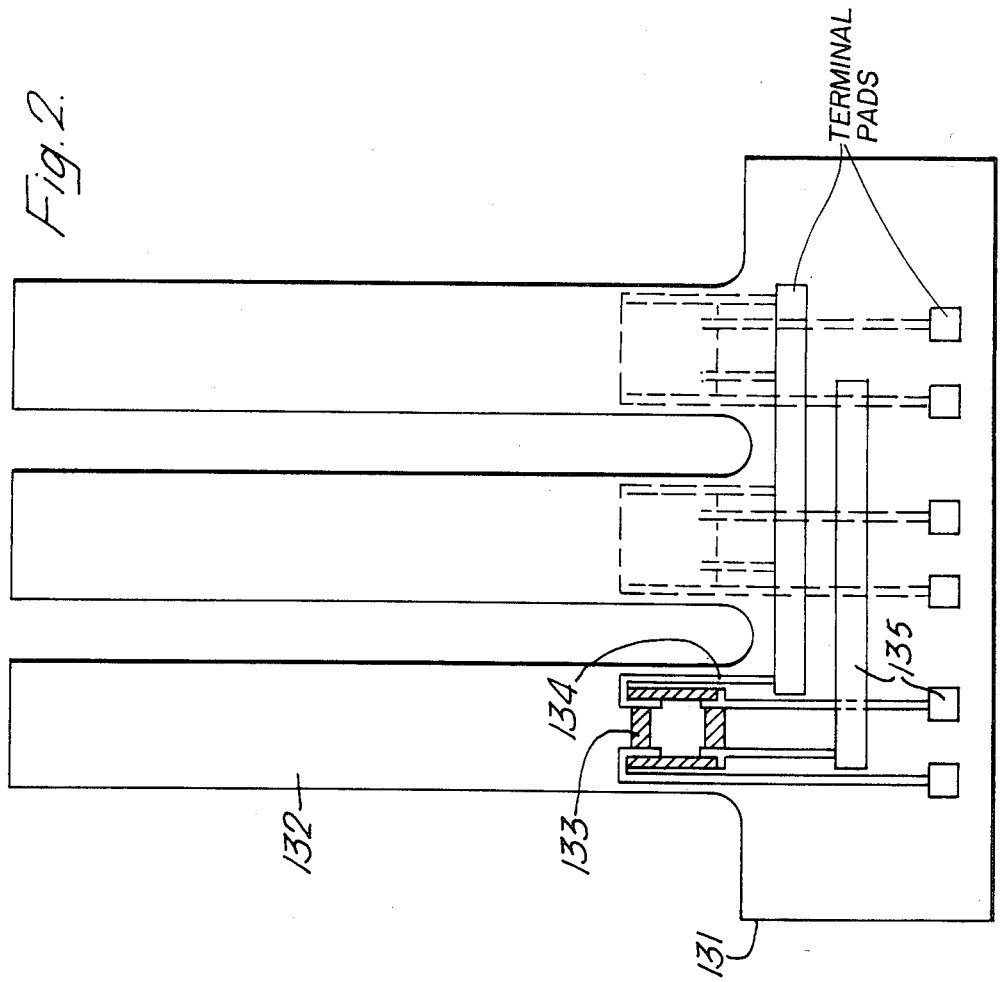

FIGS. 2 and 3 show the transducer element in detail. The element 25 comprises a mounting portion 131 from which one ore more resilient flexible arms 132 extend, each arm 132 having piezo-resistive bridge arrangement 133 formed thereon. Connection of the current paths in which transducer elements 25 are utilized to each bridge is effected via conductive tracks 134, e.g., of aluminum, which connect to terminal pads 135 which form part of a powered line or current path to be switched. Flexing of an arm 132 causes resistance changes in the corresponding bridge 133 thus altering the balance condition of that bridge. It is this change that is detected by the amplifier 29 (FIG. 1).

Although FIG. 2 shows a three element transducer it will be clear that similar arrangements can be made with other numbers of elements including one.

Typically the transducer element is formed as an integral component from single crystal silicon. The mounting portion may be about 0.25 mm thick and the arms 0.025 mm thick, i.e., a thickness ratio of 10 to 1. Advantageously the thickness ratio is between 8 to 1 and 12 to 1. The bridges 33 may be diffused into the arms at the point of maximum strain which is adjacent the point of attachment of the arm to the mounting member. The bridge resistors are, in the unstressed condition of the device, substantially equal in value and are typically in the range 1k ohm to 10k ohm.

It is preferred to obtain maximum voltage change in the current paths in which the switch is installed at the bridge output within the strain limits imposed by the transducer material (approximately 0.3% for silicon). The transducer element may therefore be deflected in both a positive and a negative direction about is undeflected position and in each case the strain limits need not be exceeded. Thus to obtain maximum output from the bridge the cantilever must be deflected from its maximum negative deflection position to its maximum positive deflection position. To achieve this in practice a cantilever leaf spring 31 (FIG. 1) may be provided on the transducer block 26 and positioned abutting projection 32 such that its free end is in line with the free end of the transducer cantilever 25. After assembly of the transducer block into the switch body, this spring is caused to deflect, by a projection 33 on the code disc follower body, it then forces the end of each transducer cantilever into a configuration whereby the end of each transducer is in contact with the corresponding code disc follower which in turn is forced into engagement with the code wheel serrations. This deflects the cantilever away from its unstressed position. Rotation of the switch spindle then causes the follower to deflect between two oppositely stressed conditions in response to the coded serrations. The resultant resistance change of each cantilever resistance bridge 133 is amplified by the operational amplifier chip mounted on or adjacent the transducer block. By ensuring that the leaf spring is clear of the transducer cantilever until after the block is assembled in the switch body the thin relatively fragile cantilever is protected from breakage due to excessive applied force.

What is claimed is:

1. A contactless electrical switch, including: a switch element comprising a piezo-resistive body flexibly moving between first and second configurations corresponding to oppositely stressed conditions; said body having an unstressed condition between said oppositely stressed conditions; a rotatable code disc means forcing said body into said configurations; said disc means having an undulated periphery; and means for resiliently urging said body away from its unstressed condition.

2. A contactless electrical switch, including two or more flexible piezoelectric transducer elements, a rotatable code disc having toothed cams; cam followers translating rotational movement of said cams into reciprocal movement of said transducer elements; sensing means coupled to said transducer elements for sensing resistance change thereon and transmitting signals into corresponding current paths.

3. A switch as claimed in claim 2, wherein the transducer elements are mounted on a carrier disposed adjacent the toothed cam.

4. A switch as claimed in claim 3, wherein said carrier is provided with spring means whereby the transducer elements are urged away from an unstressed condition.

5. A switch as claimed in claim 4, wherein said spring means comprises a leaf spring mounted on said carrier.

6. A switch as claimed in claim 5, wherein said transducer elements comprise an integral structure formed from single crystal silicon.

7. A switch as claimed in claim 6, wherein the transducer elements comprise a plurality of cantilever springs extending from and integral with a silicon body.

8. A switch as claimed in claim 7, wherein the ratio of the thickness of the cantilever springs to that of the body is between 8 to 1 and 12 to 1.

9. A switch as claimed in claim 8, wherein said sensing means include an amplifier which is operatively coupled to said transducer.

10. A transducer assembly for a contactless switch, the assembly including: a support structure, one or more flexible piezo-resistive transducer elements mounted on the support structure, spring means mounted on the support structure adjacent one or more transducer elements whereby each said element is resiliently urged away from an unstressed condition; said transducer elements changing their resistance in response to intermittent application of forces thereon caused by a rotatable disc, said disc having code serrations affecting said transducer element resistance.

* * * * *